United States Patent

Saeedi et al.

(10) Patent No.: US 10,419,128 B2
(45) Date of Patent: Sep. 17, 2019

(54) LOW-Q INDUCTIVE-PEAKING OPTICAL FRONT-END

(71) Applicant: Axalume, Inc., San Diego, CA (US)

(72) Inventors: Saman Saeedi, San Diego, CA (US); Ashok V. Krishnamoorthy, San Diego, CA (US)

(73) Assignee: Axalume, Inc., San Diego, CA (US)

( * ) Notice: Subject to any disclaimer, the term of this patent is extended or adjusted under 35 U.S.C. 154(b) by 0 days.

(21) Appl. No.: 16/039,004

(22) Filed: Jul. 18, 2018

(65) Prior Publication Data

US 2019/0028207 A1 Jan. 24, 2019

Related U.S. Application Data

(60) Provisional application No. 62/534,207, filed on Jul. 19, 2017.

(51) Int. Cl.

| *H04B 10/69* | (2013.01) |
| *H04B 10/67* | (2013.01) |
| *H01L 31/00* | (2006.01) |
| *H04B 10/60* | (2013.01) |
| *H04B 10/50* | (2013.01) |
| *H04B 10/40* | (2013.01) |

(52) U.S. Cl.
CPC .......... *H04B 10/6911* (2013.01); *H01L 31/00* (2013.01); *H04B 10/673* (2013.01); *H04B 10/695* (2013.01); *H04B 10/40* (2013.01); *H04B 10/50* (2013.01); *H04B 10/60* (2013.01)

(58) Field of Classification Search
None
See application file for complete search history.

(56) References Cited

U.S. PATENT DOCUMENTS

| 2,598,683 | A | * | 6/1952 | Golay | ...................... H03H 7/32 |
| | | | | | 333/140 |
| 4,959,535 | A | * | 9/1990 | Garrett | ................... H03H 7/075 |
| | | | | | 250/214 A |
| 5,367,156 | A | * | 11/1994 | Domon | .............. H04B 10/6911 |
| | | | | | 250/214 RC |
| 2007/0045773 | A1 | * | 3/2007 | Mi | ...................... H01F 17/0006 |
| | | | | | 257/531 |
| 2014/0110821 | A1 | * | 4/2014 | Barry | ..................... H01L 28/10 |
| | | | | | 257/531 |

* cited by examiner

*Primary Examiner* — Darren E Wolf
(74) *Attorney, Agent, or Firm* — Steven Stupp

(57) ABSTRACT

An integrated circuit that includes an optical receiver is described. This integrated circuit may include an optical receiver. The optical receiver may include a photodiode that receives an optical signal and that outputs a corresponding current. Moreover, the optical receiver may include an inductor that is electrically coupled to the photodiode. Furthermore, the optical receiver may include a resistive analog front-end stage that is electrically coupled to the inductor. Note that the inductor may have a resistance per unit length that is greater than a first threshold value (such as 40 mΩ/μm), and the inductor may be approximately dispersion-less. For example, a Q factor for inductive peaking associated with the inductor is less than a second threshold value (such as 5).

20 Claims, 8 Drawing Sheets

LOW-Q INDUCTIVE-PEAKING OPTICAL FRONT-END

CROSS REFERENCE TO RELATED APPLICATIONS

This application claims priority under 35 U.S.C. 119(e) to U.S. Provisional Application Ser. No. 62/534,207, entitled "Low-Q Inductive-Peaking Optical Front-End," by Saman Saeedi, Jock Bovington and Ashok V. Krishnamoorthy, filed on Jul. 19, 2017, the contents of which are herein incorporated by reference.

BACKGROUND

Field

The present disclosure relates to techniques for optical communication. More specifically, the present disclosure relates to an optical interconnect with a low-Q inductive-peaking optical front-end.

Related Art

Optical links or interconnects usually include optical receivers that convert optical signals to electrical signals. These optical receivers often have an analog front-end followed by analog-to-digital conversions for subsequent processing of the electrical signals in the digital domain. Some optical front-end circuits use inductive peaking techniques to enhance the bandwidth.

Conventional optical front-end inductive-peaking techniques typically require high-quality-factor inductors (e.g., with a low series resistance), and therefore usually have thick on-chip wires for inductor design. However, using thick metals for inductor design often makes the indictors highly capacitive, which reduces the effectiveness of the bandwidth enhancement.

SUMMARY

One embodiment of the present disclosure provides an integrated circuit. This integrated circuit includes an optical receiver. The optical receiver includes a photodiode that receives an optical signal and that outputs a corresponding current. Moreover, the optical receiver includes an inductor that is electrically coupled to the photodiode. Furthermore, the optical receiver includes a resistive analog front-end stage that is electrically coupled to the inductor. Note that the inductor has a resistance per unit length that is greater than a first threshold value and the inductor is approximately dispersion-less.

Moreover, the resistive analog front-end stage may include an amplifier and a resistor electrically coupled to ground and an input to the amplifier.

Furthermore, a ratio of the resistance per unit length of the inductor to an inductance per unit length of the inductor may be approximately equal to a ratio of the conductance per unit length of the inductor to a capacitance per unit length of the inductor.

Additionally, a phase velocity associated with the inductor may be approximately equal to a group velocity of the inductor.

Note that a quality (Q) factor for inductive peaking associated with the inductor may be less than a second threshold value. For example, the second threshold value may be 5.

In some embodiments, the inductor has a resistance that is greater than 1Ω and a capacitance less than 100 fF. Moreover, the inductor may have a conductance that is greater than 1 k℧.

Furthermore, the first threshold value may be 40 mΩ/μm.

Other embodiments provide an electronic device that includes an integrated circuit that includes an optical receiver, such as the integrated circuit.

Other embodiments provide a method for receiving an optical signal, which may be performed by an integrated circuit that includes an optical receiver, such as the integrated circuit.

This Summary is provided merely for purposes of illustrating some exemplary embodiments, so as to provide a basic understanding of some aspects of the subject matter described herein. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE FIGURES

Note that like reference numerals refer to corresponding parts throughout the drawings. Moreover, multiple instances of the same part are designated by a common prefix separated from an instance number by a dash.

DETAILED DESCRIPTION

An integrated circuit that includes an optical receiver is described. This integrated circuit may include an optical receiver. The optical receiver may include a photodiode that receives an optical signal and that outputs a corresponding current. Moreover, the optical receiver may include an inductor that is electrically coupled to the photodiode. Furthermore, the optical receiver may include a resistive analog front-end stage that is electrically coupled to the inductor. Note that the inductor may have a resistance per unit length that is greater than a first threshold value (such as 40 mΩ/μm), and the inductor may be approximately dispersion-less. For example, a Q factor for inductive peaking associated with the inductor is less than a second threshold value (such as 5).

By reducing the Q factor of the inductor (or, alternatively, by increasing the resistance of the inductor and reducing the capacitance of the inductor, this communication technique may enhance the bandwidth of the optical receiver when implemented on-chip (i.e., on the integrated circuit). For example, the bandwidth may be increased by more than 50% relative to other inductive-peaking techniques. Consequently, the communication technique may enable increased communication performance in optical links, such as silicon-photonic links, optical fibers, etc.

Figure 1:
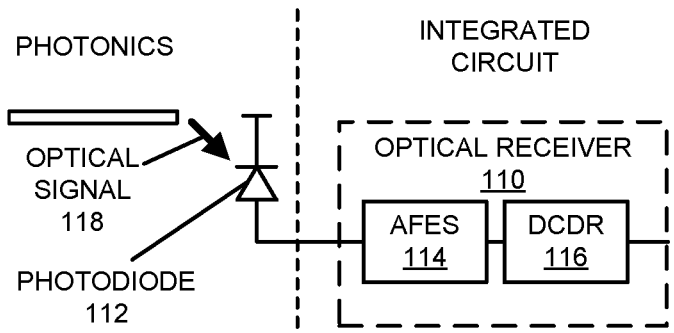
FIG. 1 is a drawing illustrating an example of an optical receiver in accordance with an embodiment of the present disclosure.

We now describe embodiments of the optical receiver. FIG. 1 presents a drawing that illustrates an example of an optical receiver 110. This optical receiver is designed to distinguish '0's and '1's in a stream of data it receives in the form of an optical signal 118, and to convert optical signal 118 into an electrical signal 120. As shown in FIG. 1, a photodiode 112 is commonly used to convert optical signal 118 into an electrical current followed by a current-to-voltage front-end stage 114 and a digital and clock-data-recovery (DCDR) stage 116.

Figure 2:
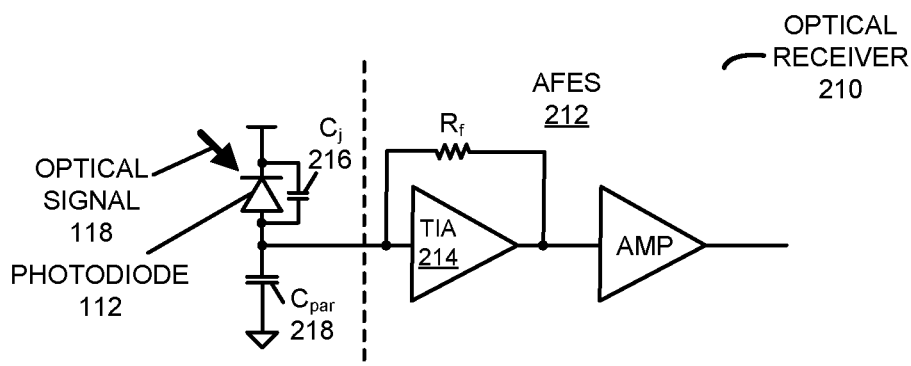
FIG. 2 is a drawing illustrating an example of an optical receiver in accordance with an embodiment of the present disclosure.

Because of junction capacitance and the packaging parasitic capacitance in photodiode 112, an input node of the analog front-end stage (AFES) 114 conventionally has been the dominant pole of the system, which creates a bottle-neck in the data-rates of optical receiver 110. In order to address this problem, a trans-impedance amplifier (TIA) can be used to reduce the input impedance seen from the input node of the analog-front-end stage, while reducing the input-referred noise of the subsequent stages. This is shown in FIG. 2, which presents a drawing illustrating an example of an optical receiver 210 with a TIA-based receiver analog front-end stage 212. Notably, in some photonic and packaging technologies, where junction capacitance ($C_j$) 216 and packaging parasitic capacitance ($C_{par}$) 218 in photodiode 112 is significant, the advantages of TIAs may be magnified. Note that the input resistance of TIA 214 is $$R_{in} = \frac{R_f}{1+A},$$

where $R_f$ is the feedback resistance and A is the gain of the amplifier at DC. The pole $P_{in}$ associated with input node is therefore pushed back by a factor of (1+A):

$$P_{in} = \left( \frac{\frac{1}{2\pi}}{\frac{R_f(C_{in} + C_j + C_{par})}{1+A}} \right) = \left( \frac{1+A}{2\pi R_f(C_{in} + C_j + C_{par})} \right),$$

where $C_{in}$ is the input capacitance to TIA 214 and A is the gain of TIA 214.

However, given the recent breakthroughs in low-cap silicon-photonics and integration/packaging technology, the junction and parasitic capacitances are typically significantly reduced. Therefore, the input node is usually no longer the dominant pole of the analog front-end stage 212, which may eliminate the need to reduce the input impedance of the analog front-end stage 212.

Figure 3:
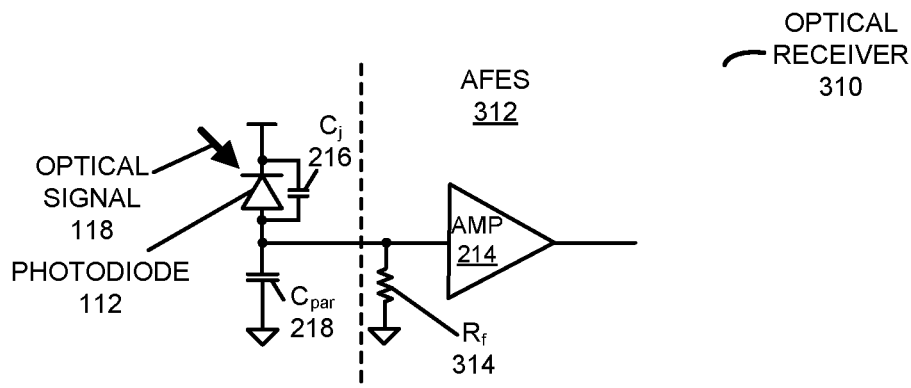
FIG. 3 is a drawing illustrating an example of an optical receiver in accordance with an embodiment of the present disclosure.

Moreover, as the receiver data-rate increases, it may be necessary to use scaled semiconductor technologies with larger high-frequency figure of merit $F_t$, but limited headroom and lower gain. However, a lower gain may reduce the effectiveness of TIAs in terms of reducing the input impedance of the analog front-end stage and the input referred noise. Consequently, as shown in FIG. 3, which presents a drawing of an example of an optical receiver 310 with a resistive analog front-end stage 312, in some embodiments a resistive front-end using resistance ($R_f$) 314 is an attractive alternative that eliminates the overhead and complexity of ineffective TIAs in advanced CMOS technologies. In these embodiments, the input-node pole may be located at $$P_{in} = \frac{1}{2\pi(R_f(C_{in} + C_j + C_{par}))}.$$

Note that resistive analog front-end stages can provide reduced non-linearity and reduced sensitivity to input bias, which often makes them attractive alternatives for burst-mode applications.

Figure 4:
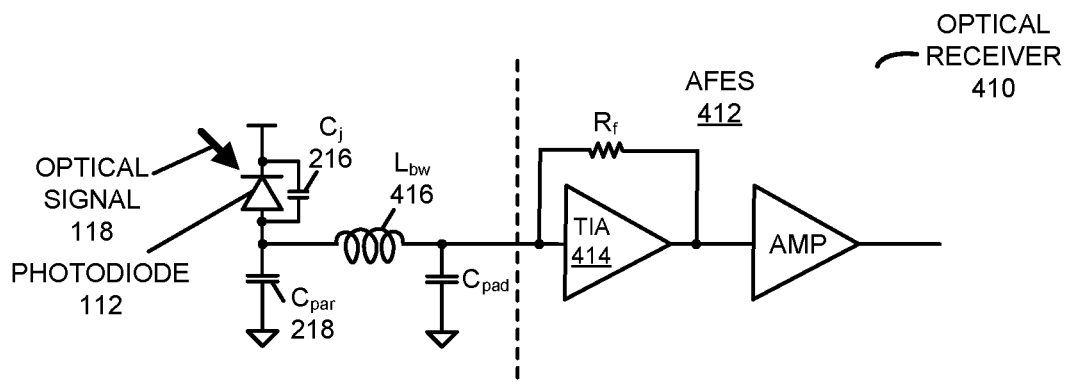
FIG. 4 is a drawing illustrating an example of an optical receiver in accordance with an embodiment of the present disclosure.
Figure 5:
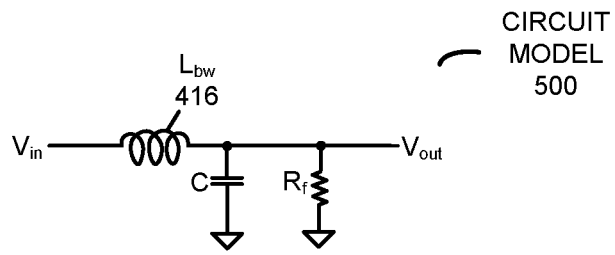
FIG. 5 is a drawing illustrating an example of a circuit model of inductive peaking using the inductance of bondwires in accordance with an embodiment of the present disclosure.

Furthermore, as shown in FIG. 4, which presents a drawing of an example of an optical receiver 410, in some packaging and photonic technologies inductive peaking in optical front-end stages has been employed as part of the packaging of the electronics and photonics using the inductance ($L_{bw}$) 416 of the bondwire. Because of the high input-node capacitance (including the pad parasitic capacitance $C_{pad}$ and the TIA input capacitance $C_{in}$), a high-Q inductor creates the necessary peaking to extend the bandwidth of analog front-end stage 412. Note that, because of the low input-resistance of TIA 414

$$\left( R_{in} = \frac{R_f}{1+A} \right),$$

the series resistance associated with the low-Q inductor compromises the gain of analog front-end stage 412. As shown in FIG. 5, which presents an example of an approximate circuit model 500 of inductive peaking using the inductance of bondwires, the transfer function H(s) is $$H(s) = \frac{V_{out}}{V_{in}} = \frac{R_{in} \| \frac{1}{sC}}{L_{bw}s + R_{in} \| \frac{1}{sC}} =$$

$$\frac{R_{in}}{R_{in}L_{bw}Cs^2 + L_{bw}s + R_{in}} = \frac{1}{L_{bw}C} \cdot \frac{1}{s^2 + \frac{1}{R_{in}C}s + \frac{1}{L_{bw}C}},$$

where C is an effective capacitance. Defining $L_{bw}=mR_{in}^2C$ (where is a real number) and noting that s equals jω, $$H(j\omega) = \frac{1}{mR_{in}^2 C^2} \cdot \frac{1}{s^2 + \frac{s}{R_{in}C} + \frac{1}{mR_{in}^2 C^2}}.$$

This yields the roots $S_{1,2}$ in the denominator of $$S_{1,2} = -\frac{1}{2R_{in}C} \pm j\sqrt{\frac{1}{mR_{in}^2 C^2} - \frac{1}{(2R_{in}C)^2}}.$$

Note that resonance occurs for m<4. Factoring the real and imaginary parts yields $$S_{1,2} = \frac{1}{2R_{in}C}\left(-1 \pm j\sqrt{\frac{4}{m} - 1}\right).$$

Critical damping is achieved when m=4 and a maximally flat amplitude response is achieved by choosing m=2 to obtain the poles $$\frac{1}{2R_{in}C}(-1 \pm j).$$

However, on-chip implementation of this type of inductive peaking is often impractical. For example, for a low series resistance in the inductor (and, thus, a higher quality factor), thicker on-chip wires are usually necessary, which leads to higher capacitance that in turn defeats the purpose of having the inductor.

In order to address this problem, in the disclosed optical communication technique an optical receiver with low-Q inductive-peaking is used to extend and enhance the bandwidth of a resistive analog front-end stage. This communication technique can address a common trade-off in design of on-chip inductive peaking techniques.

Figure 6:
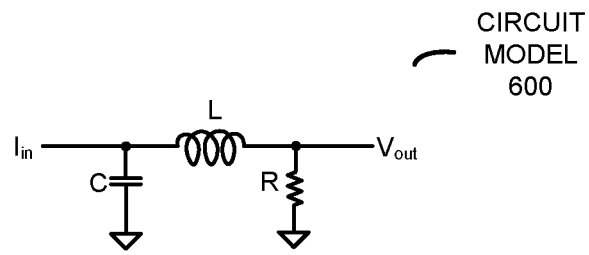
FIG. 6 is a drawing illustrating an example of a circuit model of series peaking in accordance with an embodiment of the present disclosure.

Notably, in embodiments of a resistive analog front-end stage, the input-node capacitance typically is no longer dominant and the input resistance can be kept higher. Assuming that the inductor has negligible parasitic capacitance, the inductive peaking can therefore be modeled to first order as a series-peaking topology. This is illustrated in FIG. 6, which presents an example of an approximate circuit model 600 of series peaking. For this simplified series-peaking topology the transfer function is $$H(s) = \frac{V_{out}}{I_{in}} = \frac{R}{s^2LC + sRC + 1} = \frac{1}{mR^2C^2} \cdot \frac{1}{s^2 + \frac{s}{mRC} + \frac{1}{mR^2C^2}},$$

where R is an effective resistance, L is an effective inductance, and where $m=L/R^2C$. Peaking occurs when the roots of the denominator are complex conjugates $$S_{1,2} = -\frac{1}{2mRC} \pm j\sqrt{\frac{1}{mR^2C^2} - \frac{1}{(2mRC)^2}}.$$

Figure 7:
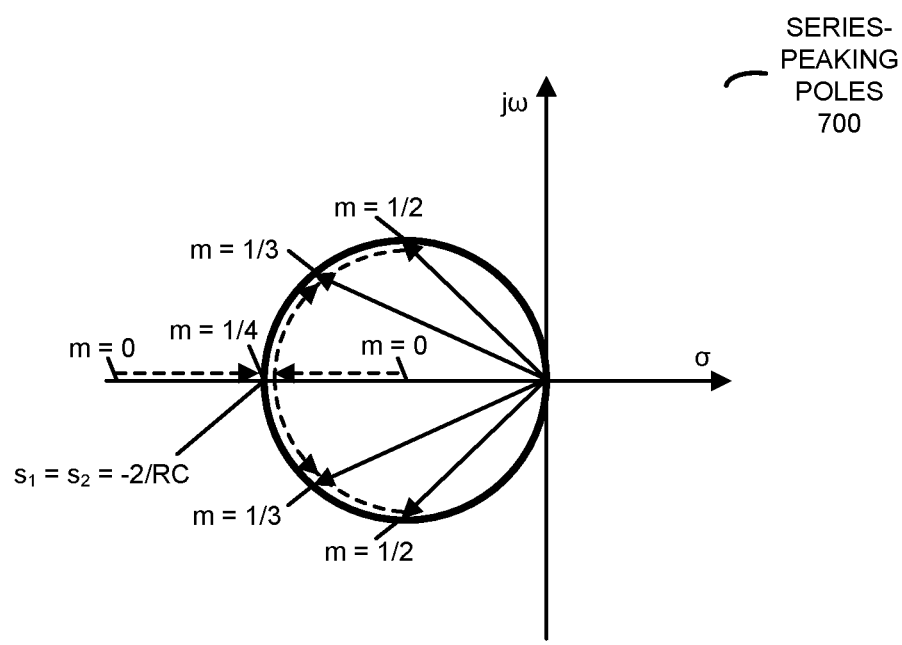
FIG. 7 is a drawing illustrating an example of series-peaking poles in accordance with an embodiment of the present disclosure.

As shown in FIG. 7, which presents a drawing illustrating an example of series-peaking poles 700 as a function of m, this means that m>0.25. Moreover, a maximally flat amplitude response is achieved when m=½.

Typically, if the parasitic capacitance of the inductor is comparable with the capacitance of the input node (including the capacitance associated with the junction capacitance and the parasitic capacitance of the photodiode), a new dominant pole is created. This new pole may reduce the bandwidth of the overall front-end stage compared with an optical receiver without inductive peaking.

Figure 8:
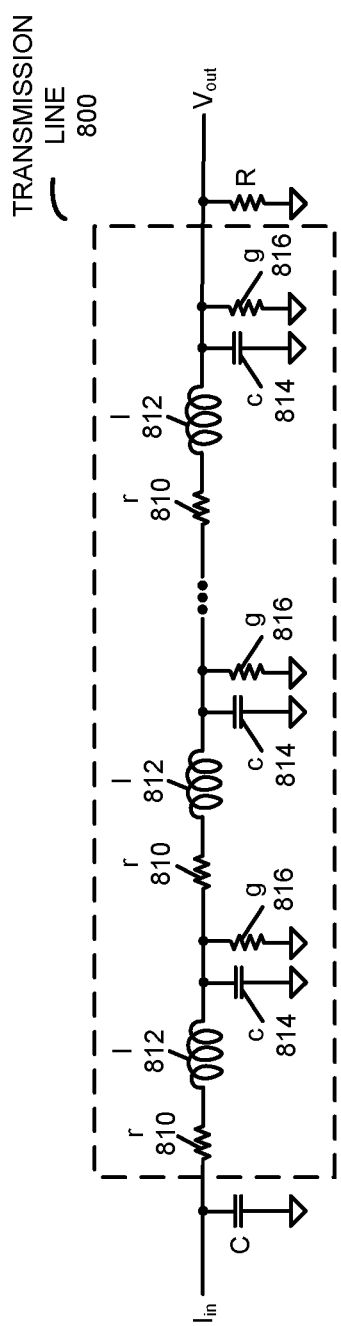
FIG. 8 is a drawing illustrating an example of a distributed transmission line in accordance with an embodiment of the present disclosure.

In the disclosed communication technique, this trade-off is avoided in an optical receiver by demonstrating effective inductive peaking through a lower-quality on-chip inductor. As shown in FIG. 8, which presents a drawing illustrating an example of a transmission line 800, a lower quality inductor can be modeled as a distributed RLGC transmission line. In FIG. 8, r 810 is the resistance (R) per unit length, l 812 is the inductance (L) per unit length, c 814 is the capacitance (C) per unit length and g 816 is the conductance (G) to ground. Typically, in an on-chip inductor, g 816 is very small. The corresponding wave-propagation equation can be written in the form of current I or voltage V at distance z from the beginning of the transmission line $$\frac{d^2V(z)}{dz^2} - \gamma^2 V(z) = 0$$

or $$\frac{d^2I(z)}{dz^2} - \gamma^2 I(z) = 0,$$

where propagation constant is $\gamma = \sqrt{(R+j\omega L)(G+j\omega C)} = \alpha + j\beta$. Note that the real and imaginary parts of the propagation constant are defined as $\alpha$ and $\beta$, and are, respectively, referred to as the 'attenuation coefficient' and the 'phase change coefficient'.

The phase velocity $v_p$ and group velocity $v_g$ of the wave are defined as $$v_p = \frac{\omega}{\beta}$$

and $$v_g = \frac{\partial \omega}{\partial \beta}.$$

In order to design a dispersion-less lossy transmission line (or, in these embodiments, an inductor), the group velocity and phase velocity need to match. If r 810, l 812, c 814 and g 816 are chosen so that $$\frac{r}{l} = \frac{g}{c},$$

then $$\gamma = \alpha + j\beta = R\sqrt{\frac{1}{c}} + j\omega\sqrt{lc}$$

and $v_p = v_g = \frac{1}{\sqrt{lc}}.$

For example, with a total inductance of 1 nH and a total capacitance of 10 fF, $$\frac{r}{g} = 100 \, k\Omega^2.$$

Therefore, for r 810 of 100 mΩ/μm, g 816 is 1 MΩ$^{-1}$/μm. This means that, for a total length of 100 μm, the resistance is 10Ω while the total conductance is 10 kΩ$^{-1}$. Note that, in contrast, in conventional inductive-peaking techniques with high-Q inductors, r and l/g are both typically negligible and the propagation is inherently dispersion-less.

In addition to the constraints for peaking and between r, l, c, and g to eliminate dispersion, there is often a trade-off between the parasitic capacitance and series resistance of the inductor. In a simplified circuit model, for a given inductance, the capacitance of the inductor is proportional to the thickness of the wire and is inversely proportional to the series resistance of the inductor, $$rc|_{constant} \, l = \zeta,$$

where $\zeta$ is a constant.

Figure 9:
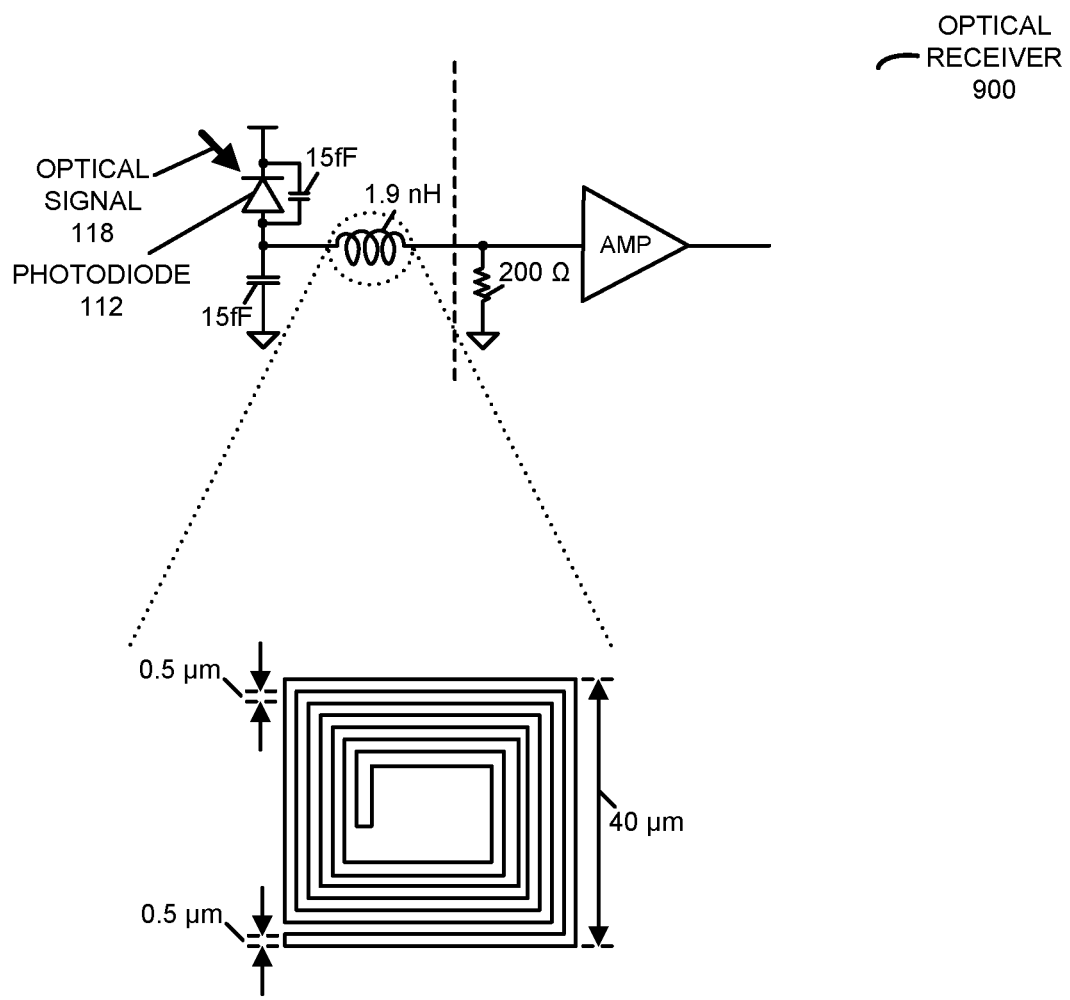
FIG. 9 is a drawing illustrating an example of an optical receiver in accordance with an embodiment of the present disclosure.

In some embodiments, the described low-Q inductive-peaking analog front-end stage is used in the design of an optical receiver in, e.g., 40 nm bulk CMOS. Applying the described set of constraints and running a numerical simulation for amplitude peaking results in the analog front-end stage design shown in FIG. 9, which presents a drawing of an example of an optical receiver 900, with an example of the inductor geometry shown in the inset. In this optical receiver, the total inductor series resistance is 15Ω, while total parasitic capacitance to ground is 14 fF.

Figure 10:
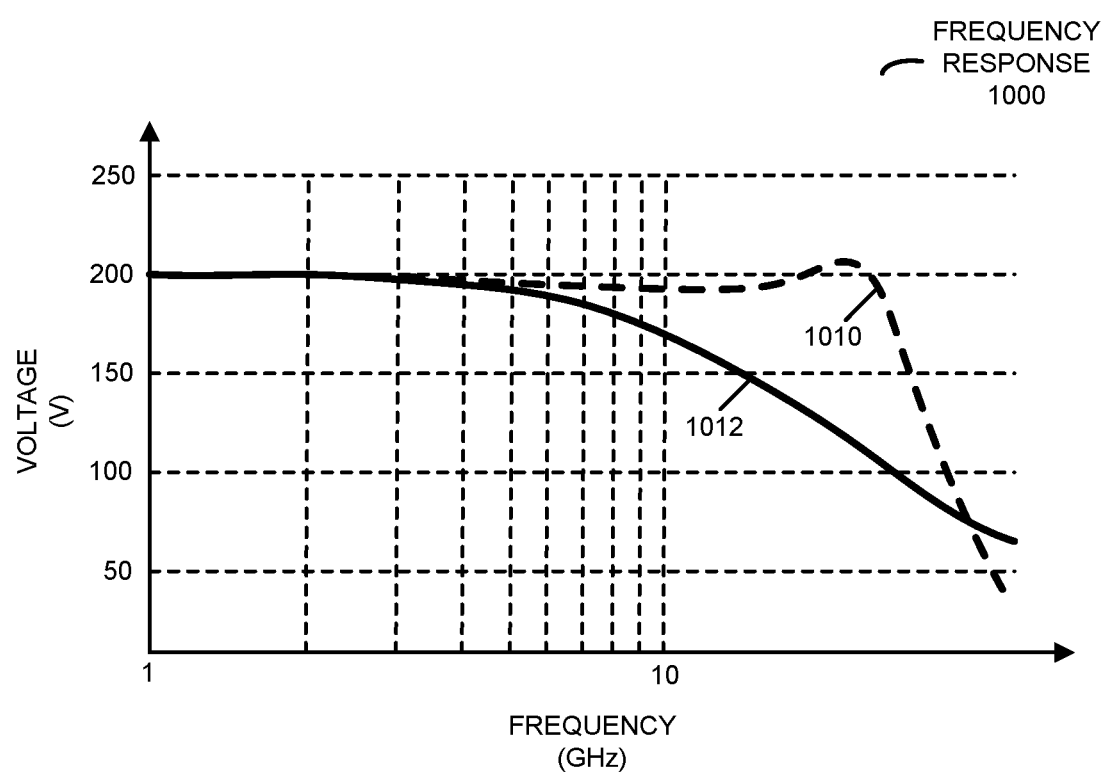
FIG. 10 is a drawing illustrating an example of a magnitude of a frequency response of an optical receiver in accordance with an embodiment of the present disclosure.

As shown in FIG. 10, which presents a drawing illustrating an example of a magnitude of a frequency response 1000 of an optical receiver with (1010) and without (1012) the inductive peaking in the communication technique, the low-Q inductive peaking may extend the bandwidth by more than 85% from, e.g., 16 GHz to more than 30 GHz.

Note that the preceding embodiments may include additional or fewer components. For example, while the preceding embodiments included a photodiode in the optical receiver, in other embodiments the photodiode may be external to the optical receiver. Thus, in these embodiments, the optical receiver may include a node that can be electrically coupled to the photodiode. Moreover, positions of one or more components may be changed, two or more components may be combined into a single component and/or a component may be divided into two or more components.

Figure 11:
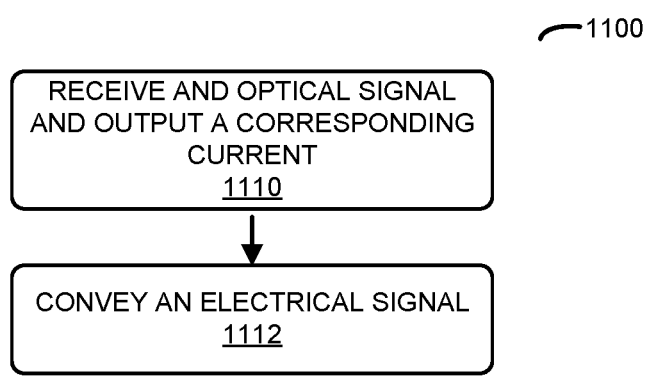
FIG. 11 is a flow diagram illustrating an example of a method for receiving optical signals in accordance with an embodiment of the present disclosure.

We now describe a method. FIG. 11 presents an example of a method 1100 for receiving an optical signal, which may be performed by an optical receiver in an integrated circuit (such as one of the integrated circuits in the preceding embodiments). During operation, a photodiode in the optical receiver receives the optical signal (operation 1110) and outputs a corresponding current (operation 1110). Then, an inductor in the optical receiver conveys the current to a resistive analog front-end stage (operation 1112). For example, the resistive analog front-end stage may include an amplifier and a resistor electrically coupled to ground and an input to the amplifier.

Note that the inductor may have a resistance per unit length that is greater than a first threshold value. For example, the first threshold value may be 40 mΩ/μm. In some embodiments, the inductor has a resistance that is greater than 1Ω and a capacitance less than 100 fF. Moreover, the inductor may have a conductance that is greater than 1 k℧.

Furthermore, the inductor may be approximately dispersion-less. For example, a ratio of the resistance per unit length of the inductor to an inductance per unit length of the inductor may be approximately equal to a ratio of the conductance per unit length of the inductor to a capacitance per unit length of the inductor. Alternatively, or additionally, a phase velocity associated with the inductor may be approximately equal to a group velocity of the inductor. In the present disclosure, 'approximately' may be understood to mean within 5, 10 or 25%.

Additionally, a Q factor for inductive peaking associated with the inductor may be less than a second threshold value. For example, the second threshold value may be 5.

In some embodiments of method 1100, there may be additional or fewer operations. Moreover, the order of the operations may be changed, and/or two or more operations may be combined into a single operation.

Figure 12:
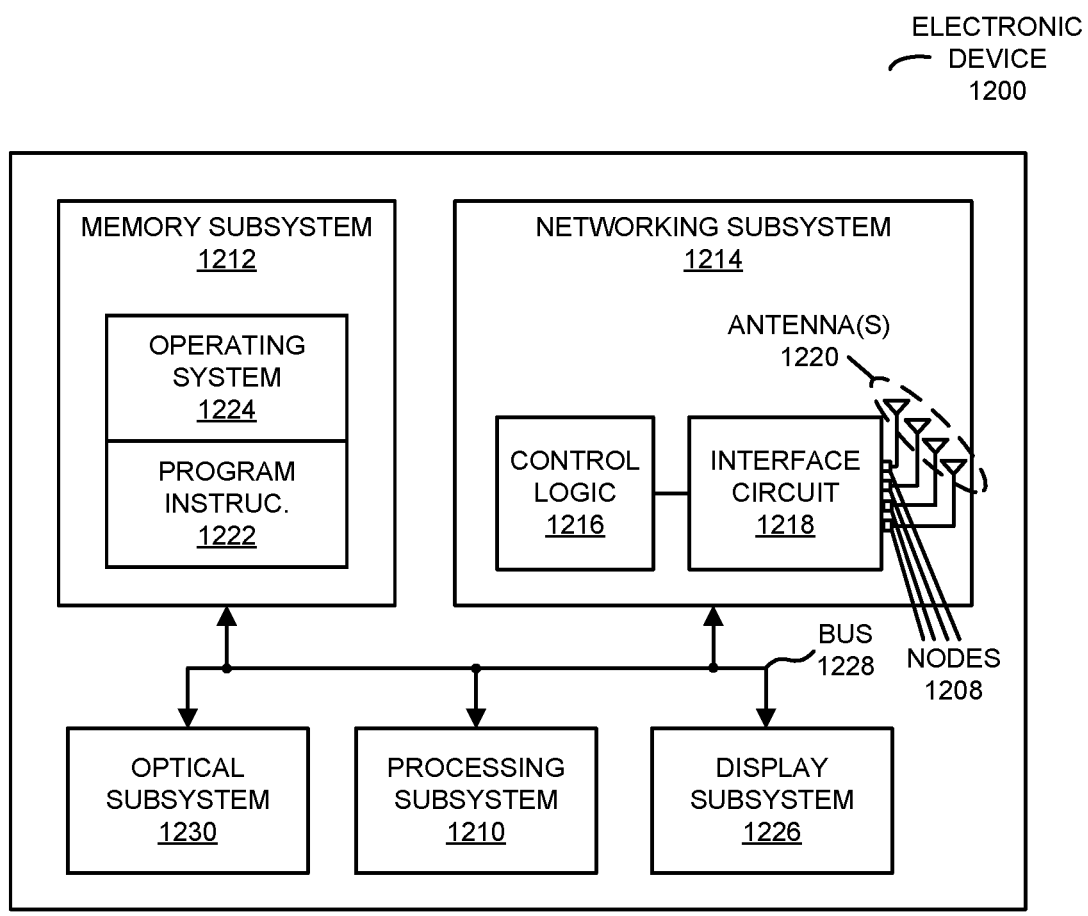
FIG. 12 is a block diagram illustrating an example of an electronic device in accordance with an embodiment of the present disclosure.

We now describe embodiments of an electronic device, which may perform at least some of the operations in the communication technique. FIG. 12 presents a block diagram illustrating an example of an electronic device 1200 (or one or more electronic devices) in accordance with some embodiments. This electronic device includes processing subsystem 1210, memory subsystem 1212, and networking subsystem 1214. Note that one or more of these subsystems may include at least an instance of one of the previous embodiments of the optical receiver. Alternatively or additionally, electronic device 1200 may optionally include one or more instances of the optical receiver in another component, such as optional optical subsystem 1230.

Processing subsystem 1210 includes one or more devices configured to perform computational operations. For example, processing subsystem 1210 can include one or more: microprocessors, ASICs, microcontrollers, programmable-logic devices, graphics processing units (GPUs) and/or digital signal processors (DSPs).

Memory subsystem 1212 includes one or more devices for storing data and/or instructions for processing subsystem 1210 and networking subsystem 1214. For example, memory subsystem 1212 can include dynamic random access memory (DRAM), static random access memory (SRAM), and/or other types of memory. In some embodiments, instructions for processing subsystem 1210 in memory subsystem 1212 include: one or more program instructions or sets of instructions (such as program instructions 1222 or operating system 1224), which may be executed by processing subsystem 1210. Note that the one or more computer programs may constitute a computer-program mechanism. Moreover, instructions in the various modules in memory subsystem 1212 may be implemented in: a high-level procedural language, an object-oriented programming language, and/or in an assembly or machine language. Furthermore, the programming language may be compiled or interpreted, e.g., configurable or configured (which may be used interchangeably in this discussion), to be executed by processing subsystem 1210.

In addition, memory subsystem 1212 can include mechanisms (such as a circuit or software) for controlling access to the memory. In some embodiments, memory subsystem 1212 includes a memory hierarchy that comprises one or more caches coupled to a memory in electronic device 1200. In some of these embodiments, one or more of the caches is located in processing subsystem 1210.

In some embodiments, memory subsystem 1212 is coupled to one or more high-capacity mass-storage devices (not shown). For example, memory subsystem 1212 can be coupled to a magnetic or optical drive, a solid-state drive, or another type of mass-storage device. In these embodiments, memory subsystem 1212 can be used by electronic device 1200 as fast-access storage for often-used data, while the mass-storage device is used to store less frequently used data.

Networking subsystem 1214 includes one or more devices configured to couple to and communicate on an optical, a wired and/or wireless network (e.g., to perform network operations), including: control logic 1216, an interface circuit 1218 and one or more optional antennas 1220 (or antenna elements). (While FIG. 12 includes one or more antennas 1220, in some embodiments electronic device 1200 includes one or more nodes, such as nodes 1208, e.g., a pad, which can be coupled to the one or more antennas 1220. Thus, electronic device 1200 may or may not include the one or more antennas 1220.) For example, networking subsystem 1214 can include a Bluetooth™ networking subsystem, a cellular networking subsystem (e.g., a 3G/4G/5G network such as UMTS, LTE, etc.), a universal serial bus (USB) networking subsystem, a networking subsystem based on the standards described in IEEE 802.11 (e.g., a Wi-Fi® networking system), an Ethernet networking subsystem, and/or another networking subsystem.

Networking subsystem 1214 includes processors, controllers, radios/antennas, sockets/plugs, and/or other devices used for coupling to, communicating on, and handling data and events for each supported networking system. Note that mechanisms used for coupling to, communicating on, and handling data and events on the network for each network system are sometimes collectively referred to as a 'network interface' for the network system. Moreover, in some embodiments a 'network' or a 'connection' between the electronic devices does not yet exist. Therefore, electronic device 1200 may use networking subsystem 1214 for performing simple wireless communication, e.g., transmitting advertising or beacon frames and/or scanning for advertising frames transmitted by other electronic devices.

Within electronic device 1200, processing subsystem 1210, memory subsystem 1212, networking subsystem 1214 and optional optical subsystem 1230 are coupled together using signal lines, links or bus 1228. These connections may include an electrical, optical, and/or electro-optical connection that the subsystems can use to communicate signals, commands and data among one another.

Furthermore, while some components are shown directly connected to one another in FIG. 12, in general coupling can also occur via intermediate components. In each instance, the method of interconnection, or 'coupling,' establishes some desired communication between two or more circuit nodes, or terminals. Such coupling may often be accomplished using a number of circuit configurations, as will be understood by those of skill in the art; for example, AC coupling and/or DC coupling may be used. Although only one bus 1228 (or one or more signal lines) is shown for clarity in FIG. 12, different embodiments can include a different number or configuration of electrical, optical, and/or electro-optical connections among the subsystems.

In some embodiments, electronic device 1200 includes a display subsystem 1226 for displaying information on a display, which may include a display driver and the display, such as a liquid-crystal display, a multi-touch touchscreen, etc.

Electronic device 1200 and/or an instance of the optical receiver may include: a VLSI circuit, a switch, a hub, a bridge, a router, a communication system (such as a wavelength-division-multiplexing communication system), a storage area network, a data center, a network (such as a local area network), and/or a computer system (such as a multiple-core processor computer system). Furthermore, electronic device 1200 and/or an instance of the optical receiver may include, but is not limited to: a desktop computer, a server (such as a multi-socket, multi-rack server), a laptop computer, a communication device or system, an access point, a router, a switch, communication equipment, a controller, test equipment, a personal computer, a work station, a mainframe computer, a blade, an enterprise computer, a data center, a tablet computer, a supercomputer, a network-attached-storage (NAS) system, a storage-area-network (SAN) system, a media player (such as an MP3 player), an appliance, a subnotebook/netbook, a tablet computer, a smartphone, a cellular telephone, a smartwatch, a network appliance, a set-top box, a personal digital assistant (PDA), a toy, a controller, a digital signal processor, a game console, a device controller, a computational engine within an appliance, a consumer-electronic device, a portable computing device or a portable electronic device, a personal organizer, a sensor (such as a LIDAR sensor), an automobile or a truck, another electronic device, a laser (such as a hybrid laser and/or another optical component).

Although specific components are used to describe electronic device 1200, in alternative embodiments, different components and/or subsystems may be present in electronic device 1200. For example, electronic device 1200 may include one or more additional processing subsystems, memory subsystems, networking subsystems, display subsystems and/or one or more additional subsystems not shown in FIG. 12 (such as a user-input subsystem). Additionally, one or more of the subsystems may not be present in electronic device 1200. Also, although separate subsystems are shown in FIG. 12, in some embodiments some or all of a given subsystem or component can be moved or integrated into one or more of the other subsystems or component(s) in electronic device 1200. For example, in some embodiments program instructions 1222 are included in operating system 1224 and/or control logic 1216 is included in interface circuit 1218. Thus, while electronic device 1200, as well as the previous embodiments of the optical receiver, are illustrated as having a number of discrete items, these components are intended to be functional descriptions of the various features that may be present rather than structural schematics of the embodiments described herein.

Moreover, the circuits and components in electronic device 1200 may be implemented using any combination of analog and/or digital circuitry, including: bipolar, PMOS and/or NMOS gates or transistors. Furthermore, signals in these embodiments may include digital signals that have approximately discrete values and/or analog signals that have continuous values. Additionally, components and circuits may be single-ended or differential, and power supplies may be unipolar or bipolar.

An integrated circuit (which is sometimes referred to as a 'communication circuit') may implement some or all of the functionality of electronic device 1200. In some embodiments, an output of a process for designing the integrated circuit, or a portion of the integrated circuit, which includes one or more of the circuits described herein may be a computer-readable medium such as, for example, a magnetic tape or an optical or magnetic disk. The computer-readable medium may be encoded with data structures or other information describing circuitry that may be physically instantiated as the integrated circuit or the portion of the integrated circuit. Although various formats may be used for such encoding, these data structures are commonly written in: Caltech Intermediate Format (CIF), Calma GDS II Stream Format (GDSII) or Electronic Design Interchange Format (EDIF). Those of skill in the art of integrated circuit design can develop such data structures from schematics of the type detailed above and the corresponding descriptions and encode the data structures on the computer-readable medium. Those of skill in the art of integrated circuit fabrication can use such encoded data to fabricate integrated circuits that include one or more of the circuits described herein.

In some embodiments, the integrated circuit may be implemented using a CMOS technology. Alternatively, the integrated circuit may be implemented using a silicon-on-insulator (SOI) technology or platform. This integrated circuit may include a substrate and a buried-oxide (BOX) layer disposed on the substrate. Moreover, a semiconductor layer may be disposed on BOX layer, where the semiconductor layer, at least in part, includes an optical waveguide. Thus, the substrate may include silicon, the BOX layer may include silicon dioxide, and the semiconductor layer may include silicon.

However, a wide variety of materials may be used to implement the integrated circuit and/or the optical waveguide, including: SOI, a semiconductor (e.g., indium phosphide, aluminum gallium arsenide, aluminum gallium nitride arsenide, aluminum gallium arsenide phosphide, a III-V compound semiconductor, etc.), and/or an insulator optical waveguide (e.g., silicon dioxide or silicon nitride). For example, the integrated circuit may include a substrate that is an insulator. Consequently, the semiconductor layer may include: silicon, silicon dioxide, and/or silicon nitride. Therefore, the integrated circuit may be implemented using a variety of integrated optical waveguide technologies.

In some embodiments, the fundamental or carrier wavelength of the optical signal in the optical waveguide is, e.g., between 1.1-1.7 μm. For example, the optical signal may have a fundamental or a carrier wavelength of 1.3 or 1.55 μm. Moreover, the semiconductor layer may have a thickness that is, e.g., less than 1 μm (such as 0.2-0.5 μm). Furthermore, the semiconductor layer may have a thickness, e.g., of 0.3 μm. Additionally, the BOX layer may have a thickness, e.g., between 0.3 and 3 μm (such as 0.8 μm).

While some of the operations in the preceding embodiments were implemented in hardware or software, in general the operations in the preceding embodiments can be implemented in a wide variety of configurations and architectures, such as by one or more: ASICs, FPGAs, DPSs, GPUs, etc. Therefore, some or all of the operations in the preceding embodiments may be performed in hardware, in software or both. For example, at least some of the operations in the communication technique may be implemented using program instructions 1222, operating system 1224 (such as a driver for interface circuit 1218) or in firmware in interface circuit 1218 or optional optical subsystem 1230. Alternatively or additionally, at least some of the operations in the communication technique may be implemented in a physical layer, such as hardware in interface circuit 1218 or optional optical subsystem 1230. In general, electronic device 1200 may be at one location or may be distributed over multiple, geographically dispersed locations.

Moreover, the preceding embodiments of the optical receiver and/or electronic device 1200 can be used in a wide variety of applications, such as: communications (for example, in a transceiver, an optical source (such as a laser), an optical interconnect or an optical link, such as for intra-chip or inter-chip communication), a radio-frequency filter, a bio-sensor, data storage (such as an optical-storage device or system), medicine (such as a diagnostic technique or surgery), a barcode scanner, metrology (such as precision measurements of distance), manufacturing (cutting or welding), a lithographic process, data storage (such as an optical-storage device or system) and/or entertainment (a laser light show).

While the preceding embodiments have been illustrated with particular elements and compounds, a wide variety of materials and compositions (including stoichiometric and non-stoichiometric compositions) may be used, as is known to one of skill in the art. Furthermore, the materials and compounds in the embodiments of the optional optical subsystem 1230 may be fabricated using a wide variety of processing techniques, including: evaporation, sputtering, chemical vapor deposition, molecular-beam epitaxy, wet or dry etching (such as photolithography or direct-write lithography), polishing, etc. In addition, a wide variety of optical components may be used in or in conjunction with one or more of the embodiments of the optional optical subsystem 1230. Furthermore, a wide variety of optical sources may be integrated with or included in one or more of the embodiments of the optional optical subsystem 1230, including many different types of lasers or non-laser optical sources (such as a light-emitting diode).

Moreover, while the preceding discussion included some numerical values, these values are for purposes of illustration and are not intended to be limiting. In other embodiments, different numerical values may be used.

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. An integrated circuit, comprising an optical receiver, wherein the optical receiver comprises:
    a photodiode configured to receive an optical signal and to output a corresponding current;
    an inductor electrically coupled to the photodiode; and
    a resistive analog front-end stage electrically coupled to the inductor, wherein the inductor has a resistance per unit length that is greater than a first threshold value, which is finite,
    wherein the inductor is approximately dispersion-less,
    wherein a phase velocity associated with the inductor is approximately equal to a group velocity of the inductor, and
    wherein approximately equal to is a difference less than 25%.

2. The integrated circuit of claim 1, wherein the resistive analog front-end stage comprises an amplifier and a resistor electrically coupled to ground and an input to the amplifier.

3. The integrated circuit of claim 1, wherein a ratio of the resistance per unit length of the inductor to an inductance per unit length of the inductor is approximately equal to a ratio of the conductance per unit length of the inductor to a capacitance per unit length of the inductor.

4. The integrated circuit of claim 1, wherein a quality (Q) factor for inductive peaking associated with the inductor is less than a second threshold value, which is finite.

5. The integrated circuit of claim 4, wherein the second threshold value is 5.

6. The integrated circuit of claim 1, wherein the inductor has a resistance that is greater than 1 Ω and a capacitance less than 100 fF.

7. The integrated circuit of claim 1, wherein the inductor has a conductance that is greater than 1 kʊ.

8. The integrated circuit of claim 1, wherein the first threshold value is 40 mΩ/μm.

9. An electronic device, comprising:
an integrated circuit, comprising an optical receiver, wherein the optical receiver comprises:
a photodiode configured to receive an optical signal and to output a corresponding current;
an inductor electrically coupled to the photodiode; and
a resistive analog front-end stage electrically coupled to the inductor, wherein the inductor has a resistance per unit length that is greater than a first threshold value, which is finite,
wherein the inductor is approximately dispersion-less,
wherein a phase velocity associated with the inductor is approximately equal to a group velocity of the inductor, and
wherein approximately equal to is a difference less than 25%.

10. The electronic device of claim 9, wherein the resistive analog front-end stage comprises an amplifier and a resistor electrically coupled to ground and an input to the amplifier.

11. The electronic device of claim 9, wherein a ratio of the resistance per unit length of the inductor to an inductance per unit length of the inductor is approximately equal to a ratio of the conductance per unit length of the inductor to a capacitance per unit length of the inductor.

12. The electronic device of claim 9, wherein a quality (Q) factor for inductive peaking associated with the inductor is less than a second threshold value, which is finite.

13. The electronic device of claim 12, wherein the second threshold value is 5.

14. The electronic device of claim 9, wherein the inductor has a resistance that is greater than 1 Ω and a capacitance less than 100 fF.

15. The electronic device of claim 9, wherein the inductor has a conductance that is greater than 1 kʊ.

16. The electronic device of claim 9, wherein the first threshold value is 40 mΩ/μm.

17. A method for receiving an optical signal, comprising:
by an optical receiver in an integrated circuit:
receiving the optical signal and outputting a corresponding current using a photodiode in the optical receiver; and
conveying the current to a resistive analog front-end stage using an inductor in the optical receiver, wherein the inductor has a resistance per unit length that is greater than a first threshold value, which is finite,
wherein the inductor is approximately dispersion-less,
wherein a phase velocity associated with the inductor is approximately equal to a group velocity of the inductor, and
wherein approximately equal to is a difference less than 25%.

18. The method of claim 17, wherein a quality (Q) factor for inductive peaking associated with the inductor is less than a second threshold value, which is finite.

19. The method of claim 17, wherein a ratio of the resistance per unit length of the inductor to an inductance per unit length of the inductor is approximately equal to a ratio of the conductance per unit length of the inductor to a capacitance per unit length of the inductor.

20. The method of claim 17, wherein the first threshold value is 40 mΩ/μm.

* * * * *